US006772389B2

(12) United States Patent
Kim et al.

(10) Patent No.: US 6,772,389 B2
(45) Date of Patent: Aug. 3, 2004

(54) TURBO DECODER USING BINARY LOGMAP ALGORITHM AND METHOD OF IMPLEMENTING THE SAME

(75) Inventors: Hyuk Kim, Taejon (KR); In-San Jeon, Taejon (KR); Woo-Seok Yang, Cheju-shi (KR); Kyung-Soo Kim, Taejon (KR); Han-Jin Cho, Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 525 days.

(21) Appl. No.: 09/966,201

(22) Filed: Sep. 26, 2001

(65) Prior Publication Data

US 2002/0116680 A1 Aug. 22, 2002

(30) Foreign Application Priority Data

Dec. 27, 2000 (KR) ........................................ 2000-83169

(51) Int. Cl.[7] ............................................. H03M 13/45
(52) U.S. Cl. ...................................... 714/780; 714/796
(58) Field of Search ................................ 714/755, 780, 714/796

(56) References Cited

U.S. PATENT DOCUMENTS

| | | | | |
|---|---|---|---|---|
| 5,412,669 A | * | 5/1995 | Foland, Jr. .................. | 714/796 |
| 5,418,795 A | * | 5/1995 | Itakura et al. ............... | 714/746 |
| 5,446,747 A | | 8/1995 | Berrou ........................ | 371/45 |
| 5,657,354 A | | 8/1997 | Thesling, III et al. ....... | 375/332 |
| 5,781,569 A | * | 7/1998 | Fossorier et al. ........... | 714/795 |
| 5,815,515 A | * | 9/1998 | Dabiri ........................ | 714/795 |
| 6,718,504 B1 | * | 4/2004 | Coombs et al. ............. | 714/755 |
| 6,725,409 B1 | * | 4/2004 | Wolf .......................... | 714/755 |

OTHER PUBLICATIONS

An Efficient Turbo Decoder Architecture for IMT2000.
A simlification of the modified bahl decoding algorithm for systematic convolutional codes.
Near Shannon Limit Error–correcting coding and decoding: turbo–dodes.

* cited by examiner

*Primary Examiner*—Stephen M. Baker
(74) *Attorney, Agent, or Firm*—Blakely Sokoloff Taylor & Zafman LLP

(57) ABSTRACT

Disclosed are a turbo decoder, which applies a base-2 binary LogMAP algorithm in implementing a turbo decoder to thereby reduce the hardware requirement and implement a high-speed turbo decoder, which comprising a split for splitting the sum of two input state metrics into an integral and a decimal part; a comparator for comparing the integral parts of the two state metrics to extract a maximum and a minimum integer; a subtractor for obtaining a difference between the original integral part and the maximum or minimum integer value; a lookup table for calculating the sum of exponential terms of base-2 function in the decimal parts; a shifter for shifting only a decimal part with a smaller integral part by the difference; an adder for adding the decimal part and a decimal part with a larger integral part; a log pre-processing block for applying a base-2 logarithm on the decimal part to thereby obtain a final value for the decimal part; and an adder for adding the maximum integral value and the final value for the decimal part to thereby obtain a final value of the base-2 function.

10 Claims, 5 Drawing Sheets

TURBO DECODER USING BINARY LOGMAP ALGORITHM AND METHOD OF IMPLEMENTING THE SAME

FIELD OF THE INVENTION

The present invention relates to a turbo decoder and method of implementing the same, which applies a base-2 binary LogMAP algorithm in implementing a turbo decoder used as an error correction code in wireless communication systems such as IMT-2000 (International Mobile Telecommunication-2000), to thereby reduce the hardware requirement and enhance the operation speed thereof as against a conventional turbo decoder based on LogMAP algorithm. The present invention also relates to a computer-readable medium storing a program for implementing the above method therein.

DESCRIPTION OF THE PRIOR ART

Recently, in the next generation mobile communication system such as IMT-2000, a turbo code is being employed as an error correction code for high-speed data transmission and a number of studies are under way on such turbo code.

An error correction approach using the turbo code has been proposed by Claude Berrou (1993), which became the center of attention in error correction applications.

It is known that the turbo code-based error correction technique has an enhanced bit error rate (BER) performance in proportional to iteration times, and has the ability to transmit information without invoking any error up to Shannon's channel capacity. C. Berrou presents a schematic structure of the turbo decoder in its reference.

In general, an algorithm for implementing the turbo decoder may be divided into two approaches: one is MAP (Maximum A Posterior) algorithm and the other is SOVA (Soft Output Viterbi Algorithm) algorithm.

The SOVA algorithm, unlike the MAP algorithm, has advantages that it minimizes a sequence error rate and decreases an overall computational complexity of the turbo decoder, thereby making it easier to implement the turbo decoder. But, the SOVA algorithm has a disadvantage that it has its bit error rate lower than that of the MAP algorithm.

On the one side, the MAP algorithm has advantages that it minimizes the bit error rate and offers a significant performance of above 0.5 dB. Unfortunately, it has an increased computational complexity thereby making it difficult to implement the turbo decoder and hence it is susceptible to parameters so that the performance of the turbo decoder is extremely vulnerable to the parameters.

Thus, a number of studies are under way on a MAP algorithm with an enhanced performance. As an example, there is disclosed a structure of turbo decoder configured by a Modified MAP algorithm by S. S. Pietrobon. Further, a turbo decoder implemented with a Field Programmable Gate Array (FPGA) has been published. In the reference proposed by S. S. Pietrobon, a conventional LogMAP algorithm is simplified to induce a base-e function and a state metric and log-likelihood ratio (LLR) are calculated using the base-e function. However, it is difficult to implement the base-e function in hardware to thereby entail an increased hardware requirement. To overcome the foregoing problems, Max-LogMAP and SubLogMAP approaches, which approximate the base-e function and operate in a logarithmic region, have been published. As an example, MAX* algorithm has been published by W. J. Gross, wherein the base-e function is modified to Jacobi logarithm which is simplified in two steps. However, such an approximation results in a degraded performance of the turbo decoder.

As described above, in implementing the conventional turbo decoder, although the LogMAP algorithm, the Sub-LogMAP algorithm, the MaxLogMAP algorithm and the SOVA algorithm are being mainly used, it is required to reduce the hardware requirement and obtain the greatest possible performance in the aspect of hardware implement such as ASIC or FPGA. Unfortunately, the conventional LogMAP algorithm, which utilizes the base-e function to implement the turbo decoder, has a disadvantage that it is difficult to implement the base-e function in hardware. In addition, the conventional SubLogMAP and MaxLogMAP approaches, although easy to implement the turbo decoder, has severe disadvantage with regard to the performance.

Accordingly, what is needed is an approach to reduce the hardware requirement without invoking a degraded performance, in implementing the turbo decoder.

SUMMARY OF THE INVENTION

It is, therefore, an object of the present invention to provide a turbo decoder and method of implementing same, which applies a base-2 binary LogMAP algorithm in implementing a turbo decoder used in an error correction code in wireless communication systems such as IMT-2000, to thereby reduce the hardware requirement and implement a high-speed turbo decoder as against a conventional turbo decoder based on LogMAP algorithm.

It is another object of the present invention to provide a computer-readable medium storing a program for implementing the above method therein.

In accordance with one aspect of the present invention, there is provided a turbo decoder used as an error correction code in wireless communication systems, wherein a binary LogMAP algorithm is used, which comprising: means for splitting the sum of two input state metrics into an integral and a decimal part; means for comparing the integral parts of the two state metrics with one another to extract a maximum and a minimum integer value therefrom; means for obtaining a difference between the original integral part and the maximum or minimum integer value; means for calculating the sum of exponential terms of base-2 function in the decimal parts of the two input state metrics split by the splitting means; means for shifting only a decimal part with a smaller integral part among the exponential sums by the difference; a first addition means for adding the decimal part shift by the shifting means and a decimal part with a larger integral part among the exponential sums; means for applying a base-2 logarithm on the decimal part added by the adding means to thereby obtain a final value for the decimal part; and a second addition means for adding the maximum integral value from the comparing means and the final value for the decimal part from the applying means to thereby obtain a final value of the base-2 function.

In accordance with another aspect of the present invention, there is provided a turbo decoder used as an error correction code in wireless communication systems, wherein a binary LogMAP algorithm is used, which comprising: means for splitting the sum of each input state metrics into an integral and a decimal part; means for comparing the integral parts of said each state metrics with one another to extract a maximum and a minimum integer value therefrom; a first subtraction means for calculating a difference between the original integral part and the maximum or minimum integer value; means for calculating the sum of exponential terms of base-2 function in the decimal parts of said each input state metrics split by the splitting means; means for shifting the sum of exponential terms of the decimal parts by the difference; a first addition means for adding the sums of exponential terms of the decimal parts shift by the shifting means; means for applying a base-2 logarithm on the decimal parts added by the first addition means to thereby obtain a final value for the decimal part; a second addition means for adding the maximum integral value from the comparing means and the final value for the decimal part from the applying means to thereby obtain a final value of the base-2 function; and a second subtraction means for subtracting likelihood values according to the final value of base-2 function to thereby obtain a log-likelihood ratio (LLR).

In accordance with yet another aspect of the present invention, there is provided a method of implementing a turbo decoder used as an error correction code in wireless communication systems, wherein a binary LogMAP algorithm is used, which comprising the steps of: (a) splitting the sum of two input state metrics into an integral and a decimal part; (b) comparing the integral parts of the two state metrics with one another to extract a maximum and a minimum integer value therefrom; (c) obtaining a difference between the original integral part and the maximum or minimum integer value; (d) retrieving the sum of exponential terms of base-2 function in the decimal parts of the two input state metrics, and shifting only a decimal part with a smaller integral part among the exponential sums by the difference; (e) adding the shifted decimal part and a decimal part with a larger integral part among the exponential sums, and applying a base-2 logarithm on the added decimal part to thereby obtain a final value for the decimal part; and (f) adding the maximum integral value and the final value for the decimal part to thereby obtain a final value of the base-2 function.

In accordance with yet another aspect of the present invention, there is provided a method of implementing a turbo decoder used as an error correction code in wireless communication systems, wherein a binary LogMAP algorithm is used, which comprising: (a) splitting the sum of each input state metrics into an integral and a decimal part; (b) comparing the integral parts of said each state metrics with one another to extract a maximum and a minimum integer value therefrom; (c) calculating a difference between the original integral part and the maximum or minimum integer value; (d) calculating the sum of exponential terms of base-2 function in the decimal parts of said each input state metrics, and shifting the sum of exponential terms of the decimal parts by the difference; (e) adding the sums of exponential terms of the shifted decimal parts, and applying a base-2 logarithm on the added decimal parts to thereby obtain a final value for the decimal part; (f) adding the maximum integral value and the final value for the decimal part to thereby obtain a final value of the base-2 function; and (g) subtracting likelihood values according to the final value of base-2 function to thereby obtain a log-likelihood ratio (LLR).

In accordance with yet another aspect of the present invention, there is provided a computer-readable medium, in a turbo decoder incorporating a processor therein, storing a program for implementing the following functions of: splitting the sum of two input state metrics into an integral and a decimal part; comparing the integral parts of the two state metrics with one another to extract a maximum and a minimum integer value therefrom; obtaining a difference between the original integral part and the maximum or minimum integer value; calculating the sum of exponential terms of base-2 function in the decimal parts of the two input state metrics, and shifting only a decimal part with a smaller integral part among the exponential sums by the difference; adding the shifted decimal part and a decimal part with a larger integral part among the exponential sums, and applying a base-2 logarithm on the added decimal part to thereby obtain a final value for the decimal part; and adding the maximum integral value and the final value for the decimal part to thereby obtain a final value of the base-2 function, wherein a binary LogMAP algorithm is used.

In accordance with yet another aspect of the present invention, there is provided a computer-readable medium, in a turbo decoder incorporating a processor therein, storing a program for implementing the following functions of: splitting the sum of each input state metrics into an integral and a decimal part; comparing the integral parts of said each state metrics with one another to extract a maximum and a minimum integer value therefrom; calculating a difference between the original integral part and the maximum or minimum integer value; retrieving the sum of exponential terms of base-2 function in the decimal parts of said each input state metrics, and shifting the sum of exponential terms of the decimal parts by the difference; adding the sums of exponential terms of the shifted decimal parts, and applying a base-2 logarithm on the added decimal parts to thereby obtain a final value for the decimal part; adding the maximum integral value and the final value for the decimal part to thereby obtain a final value of the base-2 function; and subtracting likelihood values according to the final value of base-2 function to thereby obtain a log-likelihood ratio (LLR), wherein a binary LogMAP algorithm is used.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
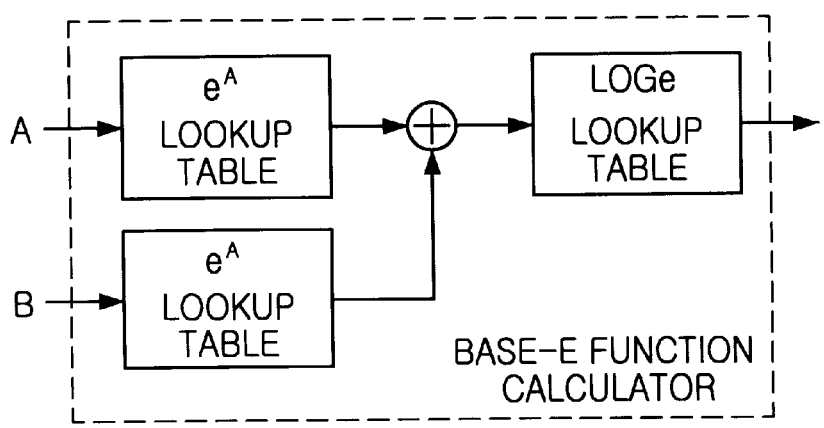
FIG. 1 is a block diagram of a base-e function calculator, which is implemented with a conventional neutral LogMAP scheme.

A binary LogMAP algorithm is induced as follows.

An equation expansion of turbo decoder for a hardware implementation has been proposed by S. S. Pietrobon (1995 and 1997), wherein a simplified Bahl decoding algorithm is disclosed. In this embodiment, 1995's equation will be used to induce the binary LogMAP algorithm.

First, equation for the MAP decoding algorithm presented in the reference (1995) proposed by S. S. Pietrobon is represented as follows:

$$\delta_i(R_k, m) = \exp(\frac{2}{\sigma^2}(x_k i + y_k Y_k^i(m))) \qquad \text{Eq. (1)}$$

$$\alpha_k^i(m) = \delta_i(R_k, m) \sum_{j=0}^{1} \alpha_{k-1}^j(S_\delta^i(m))$$

$$\beta_k^i(m) = \sum_{j=0}^{1} \beta_{K+1}^j(S_\delta^j(m)) \delta_i(R_{k+1}, S_\delta^j(m))$$

$$L(d_k) = \log \frac{\sum_m \alpha_k^1(m) \beta_k^1(m)}{\sum_m \alpha_k^0(m) \beta_k^0(m)}$$

In the present invention, since a base-2 logarithm (i.e., binary logarithm) is used, taking the base-2 logarithm with respect to the branch metrics yields the following Equation (2):

$$D_i(R_k, m) = \log_2(\delta(R_k, m)) = (\log_2 e)\left(\frac{2}{\sigma^2}\right)(x_k^j + y_k y_k^j(m)) \qquad \text{Eq. (2)}$$

Comparing Equation (2) with Equation (1) Equations (1) and (2) is identical from each other except that there is a difference therebetween by a constant $\log_2 e$. Driving Equation on forward and backward state metrics using these equations yields Equation (3) as follows:

$$A_k^i = \log_2\left(\delta(R_k, m) \sum_{j=0}^{1} \alpha_{k-1}^j(S_\delta^i(m))\right) \qquad \text{Eq. (3)}$$

$$= D_i(R_k, m) \sum_{j=0}^{1} A_{k-1}^j(S_\delta^i(m))$$

$$B_k^i(m) = \log_2\left(\sum_{j=0}^{1} \beta_{k+1}^j(S_f^j(m)) \delta_j(R_{k+1}, S_f^j(m))\right)$$

$$= \sum_{j=0}^{1} [B_{k+1}^j(S_f^j(m)) + D_j(R_{k+1}, S_f^j(m))]$$

In Equation (3), $\log_2 (2^x + 2^y) = x2y$ is defined as a base-2 function.

Comparing the above algorithm with a previous neutral LogMAP algorithm, an equivalence equation is obtained, as there is a difference therebetween only.

Finally, Log-Likelihood Ratio (LLR) serves to calculate A Posteriori Probability (APP) ratio for data bit from the forward and backward state metrics, and determine whether a decoded data bit is zero or one.

First, in the turbo decoder cited in the reference (1995) by S. Pietrobon, LLR is changed to a binary LogMAP equation as follows:

$$L(d_k) = \log \frac{\sum_{m=0}^{2^k-1} \alpha_k^1(m) \beta_k^1(m)}{\sum_{m=0}^{2^k-1} \alpha_k^0(m) \beta_k^0(m)} \qquad \text{Eq. (4)}$$

Modifying the LLR equation according to hardware MAP decoder algorithm yields the following equation:

$$L(d_k) = \log_2 \sum_{m=1}^{2^k-1} \alpha_k^1(m) \beta_k^1(m) - \log_2 \sum_{m=1}^{2^k-1} \alpha_k^0(m) \beta_k^0(m) \qquad \text{Esq. (5)}$$

$$= \log_2 \sum_{m=1}^{2^k-1} 2^{A_k^1(m) + B_k^1(m)} - \log_2 \sum_{m=1}^{2^k-1} 2^{A_1^0(m) + B_1^0(m)}$$

$$= \sum_{m=1}^{2^0-1} (A_k^1(m) B_k^1(m)) - \sum_{m=1}^{2^0-1} (A_k^0(m) B_k^0(m))$$

In Eq. (5), for both of inputs "one" and "zero", the forward and backward state metrics are respectively obtained to compute LLR. Accordingly, although there is a disadvantage that the calculation of state metric for each input should be performed, there is an advantage that LLR can be calculated only by its state value during the calculation of LLR.

In the binary LogMAP algorithm, the base-2 function instead of with base-e function is used to implement the LLR with a small-sized lookup table and logic circuit. Further, since it offers the greatest possible precision by a fixed decimal point, it has an enhanced performance as against the conventional base-e function.

An Approximated Binary Exponential and Logarithmic Algorithm (ABELA) of calculating the base-2 function are given as the follows.

First, in order to calculate $2^A$ and $2^B$, the indices A and B are divided into an integral and a decimal part (301). The indices A and B have generally a signed 2's complement form, and in case the index A is a positive number, the following Equation (6) will be given.

$$2^A = 2^{A_1 + A_f} = 2^{A_1} \times 2^{A_f} \qquad \text{Eq.(6)}$$

In Equation (6), since $A_f$ is a positive decimal less than 1, $2^{A_f}$ is in the range of $1 \leq 2^{A_f} < 2$ and may be implemented with a lookup table (302). And, since the $2^{A_f}$ represents a shift operation, the value of $2^{A_1} \times 2^{A_f}$ of may be obtained by shifting a value obtained from the lookup table by $A_i$ to the left (303).

In case the index A is a negative number, the Equation (6) can be modified as follows:

$$2^A = 2^{-A_1 - A_f} = 2^{-A_1 - 1 + 1 - A_f} = 2^{-(A_1 + 1)} \times 2^{(1 - A_f)} \qquad \text{Eq. (7)}$$

In Equation (7), since $1 - A_f$ is a positive decimal less than 1, as stated above the value may be obtained from the lookup table. Accordingly, the value of $2^{-(A_1+1)} \times 2^{(1-A_f)}$ becomes similar to the result obtained by shifting a value obtained from the lookup table by $A_i + 1$ to the right. Similarly, $2^B$ may be obtained in an identical manner as for $2^A$.

Subsequently, the addition of the $2^A$ and $2^B$ is simply performed by an adder and then the application of logarithm to an added value yields a wanted final value. Assuming that the added value is S, the calculation of the logarithm is represented using ABLA as follows:

$$S = 2^b \times 2^{-b} \times S \qquad \text{Eq. (8)}$$

In Equation (8), the value of b is the position of most significant bit (MSB) when S is expressed by binary number. That is to say, the value of b is set to be 3 for S=00001111.11110000, zero for S=00000001.11111110, and −5 for S=00000000.00001111. On the one side, substituting $2^{-b} \times S$ into S' allows Equation (8) to be modified to Equation (9) as follows:

$$S = 2^b \times S' \qquad \text{Eq. (9)}$$

Wherein S' is in the range of 1 to 2. Taking logarithm to Equation (9) yields Equation (10) as follows:

$$\log_2 S = \log_2(2^b \times S') = \log_2 2^b \times \log_2 S' = b + \log_2 S' \quad \text{Eq. (10)}$$

Wherein, $\log_2 S'$ is obtained by the lookup table 307 and is a positive decimal having the range of 0 to 1, and since b is an integer, $b + \log_2 S'$ may be implemented with an adder.

Figure 2:
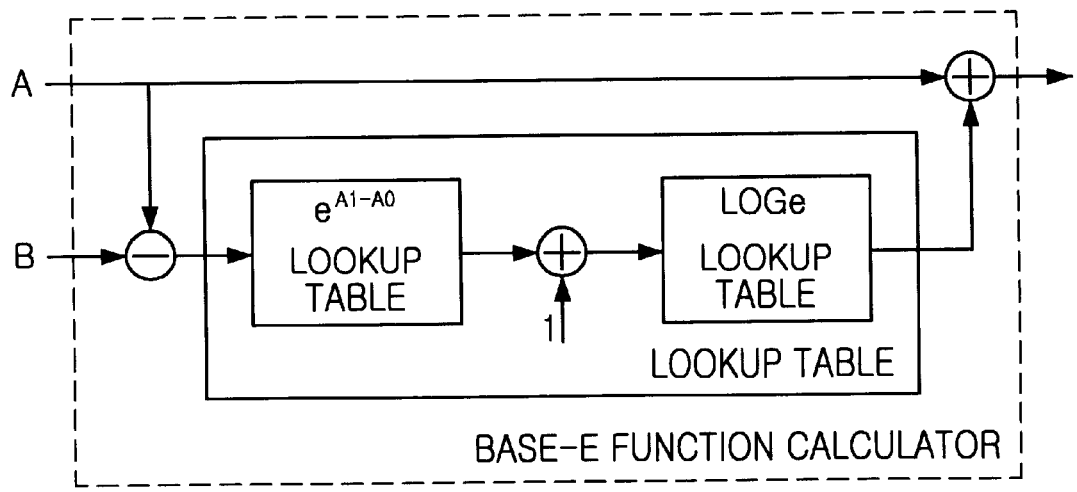
FIG. 2 is a block diagram in which the size of necessary memories of the base-e function calculator shown in FIG. 1 is reduced by saturating a value to be inputted to a lookup table thereof.

FIG. 1 is a block diagram of a base-e function calculator, which is implemented with a conventional neutral LogMAP scheme. FIG. 2 is a block diagram in which the size of necessary memories of the base-e function calculator shown in FIG. 1 is reduced by saturating a value to be inputted to a lookup table thereof. A description of the saturation is omitted in FIG. 2.

Figure 3:
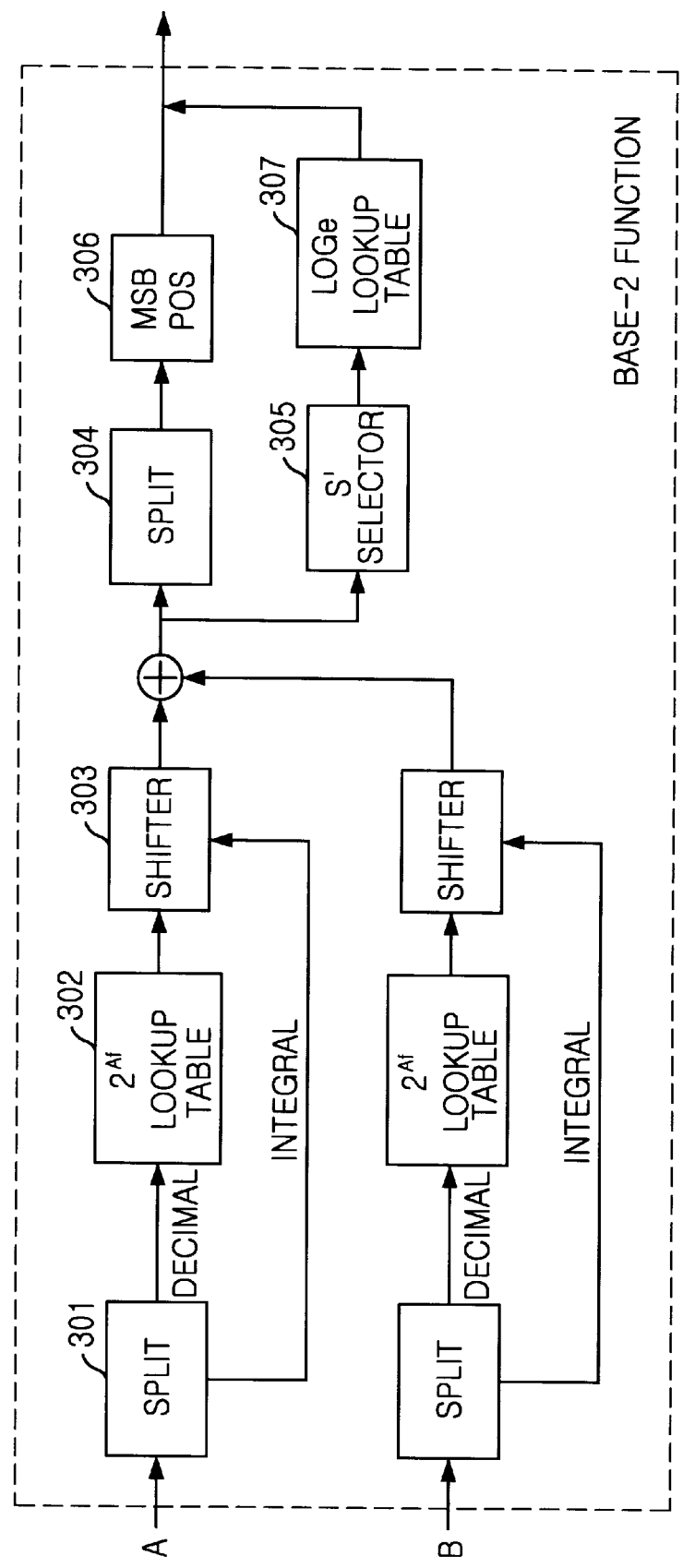
FIG. 3 is a block diagram of a base-2 function calculator, which is implemented with a conventional binary LogMAP scheme.

FIG. 3 is a block diagram of a base-2 function calculator, which is implemented with a conventional binary LogMAP scheme. In FIG. 3, an input state metric value is divided into an integral and a decimal part by a split 301. A lookup table 302 detects an exponential term of the base-2 function for the decimal part to provide it to a shifter 303, which shifts the exponential term by the integral part. The aforementioned procedure is performed on the remaining state metric and logarithm is consequently applied to it, to thereby making it possible to obtain a wanted value of base-2 function.

In comparison to the base-e function based on the neutral LogMAP algorithm, the base-2 function based on the binary LogMAP algorithm, although easy to implement hardware and obtain the greatest possible precision by the fixed decimal point, has a shortcoming that the hardware of the base-2 function of FIG. 3 is required compared with that of FIG. 2. Therefore, the following procedure is performed to further reduce the hardware requirement and allow a high-speed LLR calculation in advance. First, the equation of the base-2 function defined in the above is modified as follows:

$$2(A,B) = \log_2(2^A \times 2^B)$$
$$= \log_2(2^{A_1 A_f} + 2^{B_1 B_f})$$
$$= \log_2\{2^{\max_1}(2^{(A_1 - \max_1)A_f} + 2^{(B_1 - \max_1)})\}$$
$$= \max_i \log_2(2^{(A_1 - \max_1)} \cdot 2^{A_f} + 2^{(B_1 - \max_1)} \cdot 2^{B_f}) \quad \text{Eq. (11)}$$

Wherein, "max" represents the largest one of the integral parts of the state metrics A and B. When the base-2 function is implemented using Equation (11), the sum of exponential terms in the decimal parts of the state metrics is obtained from the lookup table and the sum obtained so is shifted by a difference between the maximum integral value and the origin integral part. Thereafter, taking logarithm with respect to the shifted result yields a wanted value of the base-2 function. That is to say, taking a positive logarithm with respect to the shifted result gives the above Equation (11) and taking a negative logarithm with respect to the shifted result yields Equation (12) as follows:

$$2(A,B) = -\log_2(2^{-A} + 2^{-B})$$
$$= -\log_2(2^{-(A_1 + A_f)} + 2^{-(B_1 + B_f)})$$
$$= \min(A_i, B_i) - \log_2(2^{(A_1 - \min)} 2^{-A_f} + 2^{(B_1 - \min)} 2^{-B_f})$$
$$= \min(A_i, B_i) + \{1 - \log_2(2^{-(A_1 - \min)} 2^{-A_f} + 2^{-(B_1 - \min)} 2^{-B_f})\} \quad \text{Eq. (12)}$$

In this case, Equation (12) is similar to Equation (11), except that it calculates a minimum value instead of a maximum value of each integral part. The original likelihood is not affected by the addition and subtraction of a constant to and from the base-2 function by virtue of the Log-Likelihood Ratio. Accordingly, in Equation (12) "one" value is added to allow the value of the decimal part to be positive.

Figure 4:
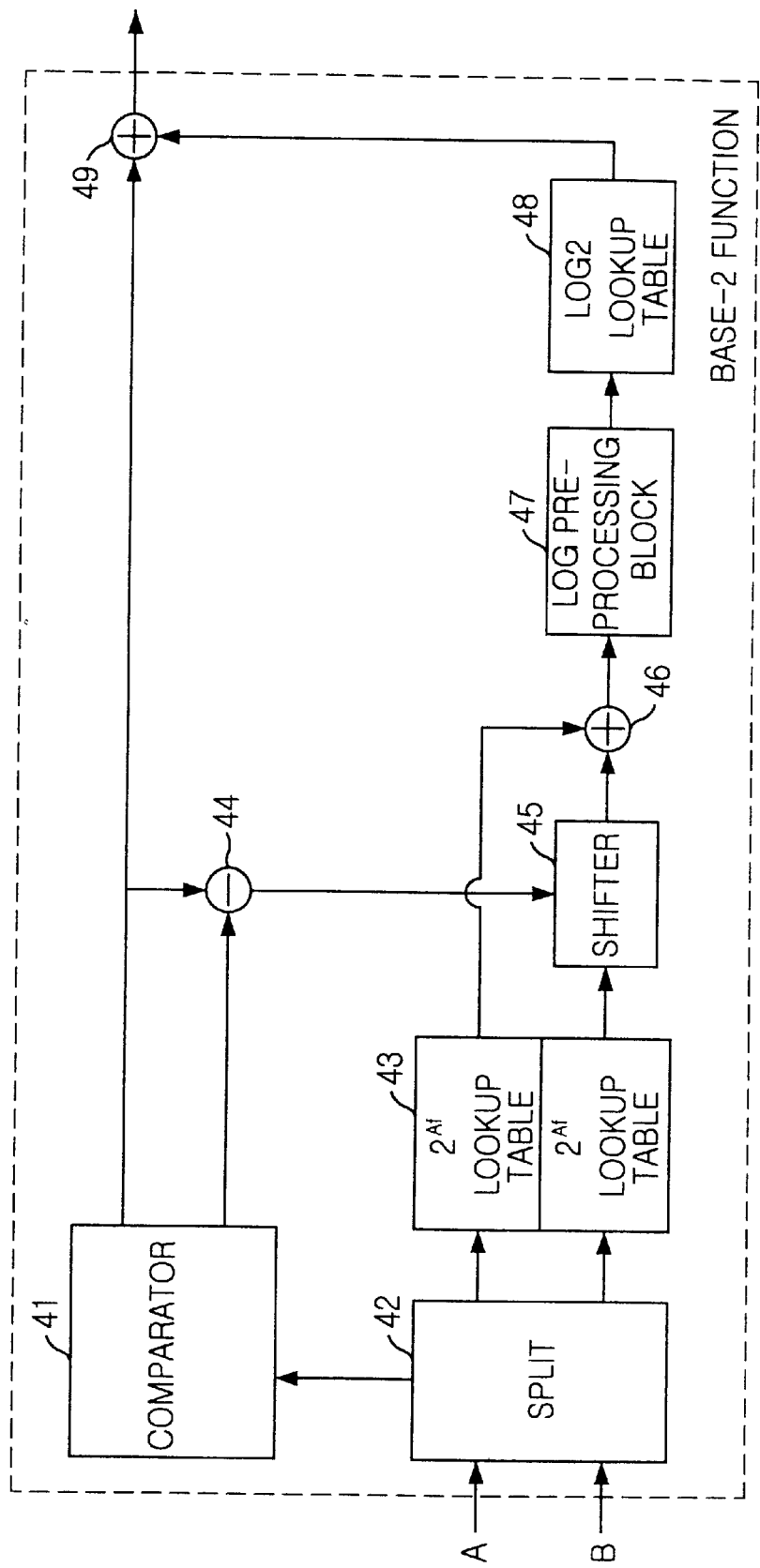
FIG. 4 shows an illustrative block diagram of the base-2 function calculator of the present invention.

Referring to FIG. 4, there is shown a block diagram illustrating a structure for implementing the above Equation (12).

As shown in FIG. 4, the turbo decoder, which uses the binary LogMAP algorithm showing the calculation of the base-2 function of the present invention, includes a split 42, a comparator 41, a subtractor 44, a $2^{af}$ lookup table 43, a shifter 45, an adder 46, a log pre-processing block 47, a $\log_2$ lookup table 48 and an adder 49.

The split 42 serves to split the sum of two input state metrics into an integral and a decimal part. The comparator 41 serves to compare the integral parts of the two state metrics with one another and extract a maximum and a minimum integer value therefrom. The subtractor 44 serves to obtain a difference between the original integral part and the maximum or minimum integer value. The lookup table 43 serves to obtain the sum of exponential terms in the decimal parts of the two input state metrics split by the split 42. The shifter 45 serves to shift only decimal part with a smaller integral part of the exponential sum by the difference between the original integral part and the maximum or minimum integer value. The adder 46 serves to add the decimal part shift by the shifter 45 and a decimal part with a larger integral part of the sum of the exponential terms. The log pre-processing block 47 and the log 2 lookup table 48 apply a base-2 logarithm on the decimal part added by the adder 46 to obtain the final value for the decimal part. The adder 49 serves to add the maximum integral value from the comparator 41 and the final value for the decimal part from the log pre-processing block 47 and the log 2 lookup table 48 to obtain a final value of base-2 function.

Specifically, at the split 42 the sum of the two input state metrics is divided into an integral and a decimal part, wherein each integral part is inputted to the comparator 41, which obtains the maximum or minimum value from the input thereof. In this case, the comparator 41 obtains the original integral part and the maximum or minimum integer value and provides them to the subtractor 44, wherein the difference between the original integral part and the maximum or minimum integer value is obtained.

On the one side, the decimal parts are inputted to the lookup table 43, which obtains the sum of exponential terms in base-2 functions, and only the decimal part with a smaller integral part is inputted to the shifter 45. Next, at the shifter 45 the decimal part with the smaller integral part of the exponential sum is shifted by the difference obtained by the comparator 41. Thereafter, at the adder 46 the decimal part shift by the shifter 45 and a decimal part with a larger integral part of the exponential sum from the lookup table 43 are added. The base-2 logarithm is performed with respect to the added value by the log pre-processing block 47 and the log 2 lookup table 48, resulting in the final value for the decimal part.

Finally, at the adder 49 the maximum integral value from the comparator 41 and the final value for the decimal part from the log 2 lookup table 48 are added to result in the final value of base-2 function.

In a conventional structure of base-2 function, since a multi-input configuration entails an increased hardware requirement, the structure shown in FIG. 4 has advantages that it decreases the hardware requirement and that allows a high-speed calculation.

Now, provided that there is four state metrics to apply a high-speed turbo decoder, the base-2 function for calculating LLR in case that the binary LogMAP algorithm is used is expressable as follows:

$$2(A,B,C,D) = \log_2(2^A + 2^B + 2^C + 2^D)$$

$$= \log_2(2^{A_1+A_f} + 2^{B_1+B_f} + 2^{C_1+C_f} + 2^{D_1+D_f})$$

$$= \max(A_i, B_i, C_i, D_i) + \log_2(2^{(max-A_1)}2^{A_f} + 2^{(max-B_1)}2^{B_f} + 2^{(max-C_1)}2^{C_f} + 2^{(max-D_1)}2^{D_f}) \quad \text{Eq. (13)}$$

As can be seen from Equation (13), a wanted value can be obtained by retrieving the largest value of the integral parts of the four state metrics; calculating the exponential sum of the decimal parts from the lookup table; shifting the calculated value by a difference between a maximum integral value and each integral part; and taking a base-2 logarithm with respect to the shifted value. To accomplish this, it is required to include a comparator for comparing the integral parts of the state metric; four lookup tables for calculating the exponential sum of the decimal parts; a shifter for shifting the result drawn from the four lookup tables by the difference between the integral parts. Further, it is required to include four adders and a logarithm processing block. Further, two pairs of these elements is required to calculate both of "one" and "zero" likelihood.

Provided that eight state metrics are inputted. Equation of base-e function for calculating LLR by natural logarithms instead of with the binary LogMAP algorithm is given as follows:

$$E(A,B,C,D,E,F,G,H) = \log_e(e^A + e^B + e^C + e^D + e^E + e^F + e^G + e^H) \quad \text{Eq. (14)}$$

Figure 5:
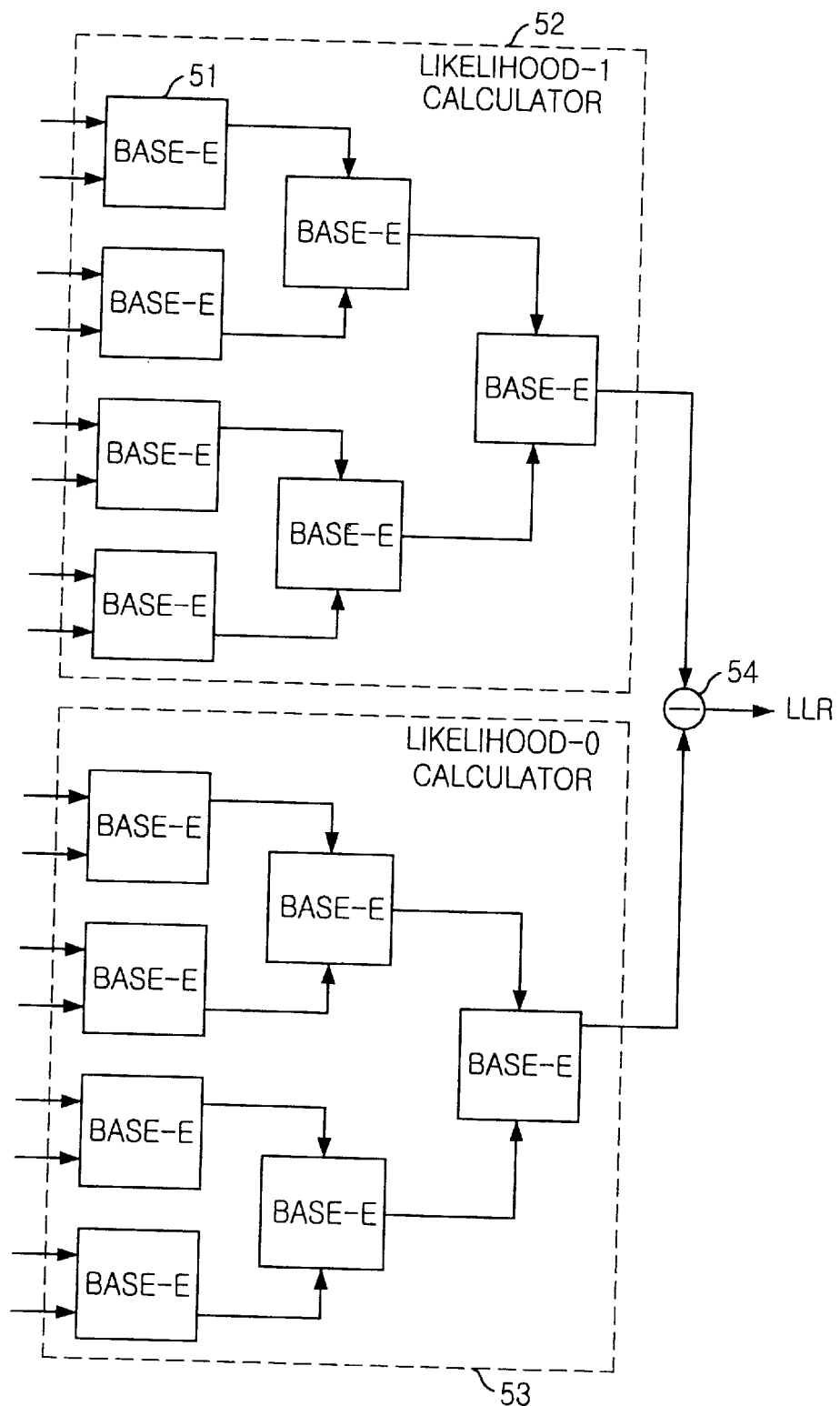
FIG. 5 is a diagram which will be used to describe an LLR calculation using natural logMAP algorithm for eight input state metrics.

Referring to FIG. 5, there is shown a LLR structure related to the above Equation (14).

As mentioned above, LLR may be obtained by subtracting zero-likelihood from one-likelihood. Observing Equation (14), the structure includes a one-likelihood calculator 52 and a zero-likelihood calculator 53 each of which having seven base-e function calculators 51, and an adder 54. In this case, the base-e function calculator 51 utilizes the structure as shown in FIGS. 1 and 2, resulting in an increased hardware requirement as much as the number of the base-e function calculator 51.

On the contrary, in the case that all eight state metrics are inputted, equation of base-2 function for calculating LLR by the binary LogMAP algorithm is given as follows:

$$2(A,B,C,D,E,F,G,H) = \log_e(e^A + e^B + e^C + e^D + e^E + e^F + e^G + e^H)$$

$$= \log_2(2^{A_1+A_f} + 2^{B_1+B_f} + 2^{C_1-C_f} + 2^{D_1+D_f} + 2^{E_1+E_f} + 2^{F_1+F_f} + 2^{G_1+G_f} + 2^{H_1+H_f})$$

$$= \max(A_i, B_i, C_i, D_i, E_i, F_i, G_i, H_i) + \log_2(2^{(max-A_1)}2^{A_f} + 2^{(max-B_1)}2^{B_f} + 2^{(max-C_1)}2^{C_f} + 2^{(max-D_1)}2^{D_f} + 2^{(max-E_1)}2^{E_f} + 2^{(max-F_1)}2^{F_f} + 2^{(max-G_1)}2^{G_f} + 2^{(max-H_1)}2^{H_f}) \quad \text{Eq. (15)}$$

Figure 6:
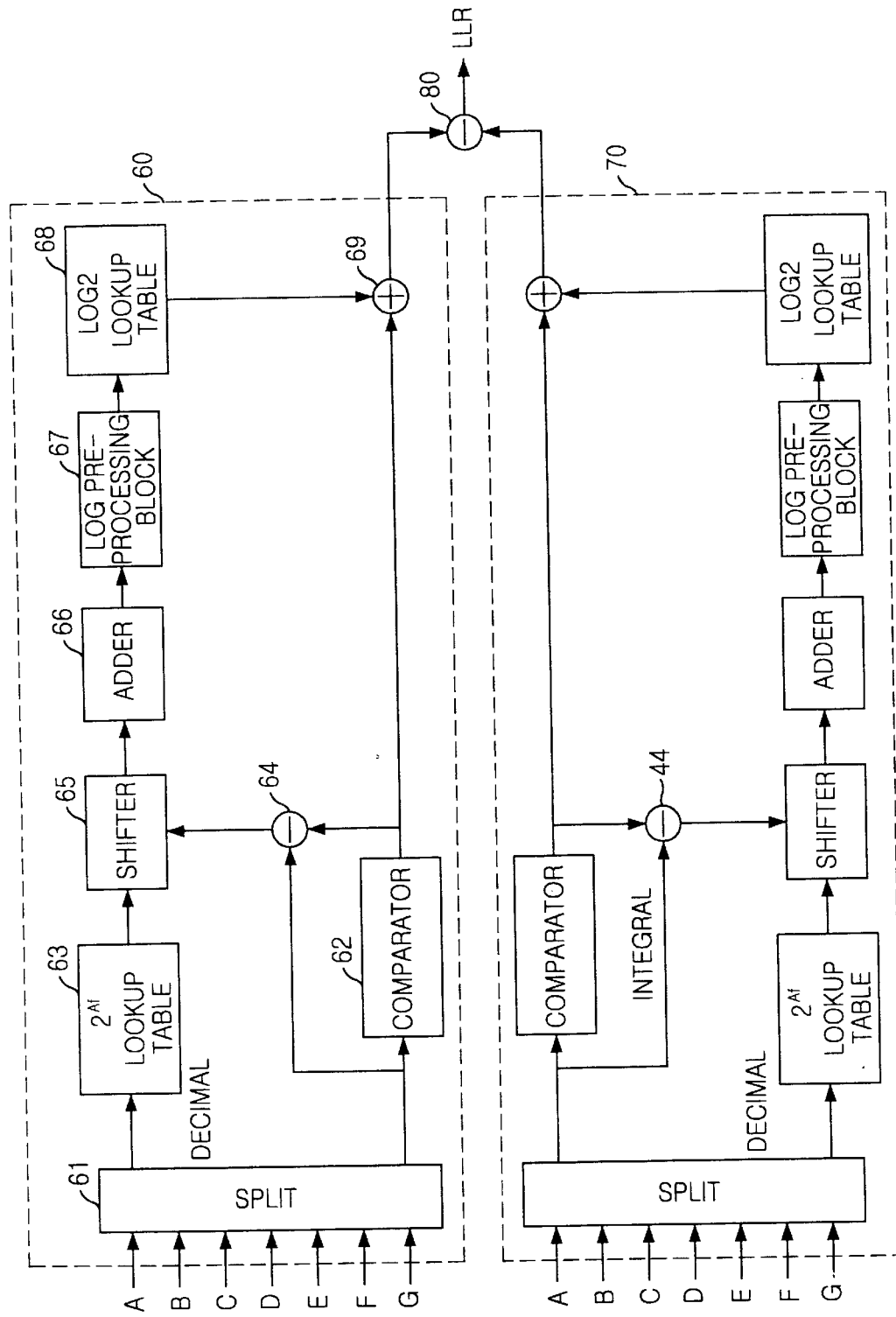
FIG. 6 is a diagram which will be used to describe an LLR calculation using binary logMAP algorithm for eight input state metrics.

Referring to FIG. 6, there is shown a structure of a LLR calculator related to the above Equation (15).

A turbo decoder using the binary LogMAP algorithm for LLR calculation includes a split 61, a comparator 62, a subtractor 64, a $2^{af}$ lookup table 63, a shifter 65, an adder 66, a log pre-processing block 67, a $\log_2$ lookup table 68, an adder 69 and a subtractor 80.

The split 61 serves to split the sum of values of each input state metric into an integral and a decimal part. The comparator 62 serves to compare the integral parts of each state metric spilt by the split 61 with one another and extract a maximum or minimum integer value therefrom. The subtractor 64 serves to obtain a difference between the original integral part and the maximum or minimum integer value. The lookup table 63 serves to obtain the sum of exponential terms of base-2 functions in the decimal parts of each state metric split by the split 61. The shifter 65 serves to shift the exponential sum of the decimal parts by the difference between the original integral part and the maximum or minimum integer value. The adder 66 serves to add the exponential values of base-2 functions for the decimal parts shift by the shifter 65. The log pre-processing block 67 and the log 2 lookup table 68 perform a base-2 logarithm on the decimal part added by the adder 66 to obtain the final value for the decimal part. The adder 69 serves to add the maximum integral value from the comparator 62 and the final value for the decimal part from the log 2 lookup table 68 to obtain a final value of base-2 function. The subtractor 80 serves to subtract likelihood values according to the final value of base-2 function to obtain LLR.

Specifically, the sum of each input state metric is divided into an integral and a decimal part at the split 61, wherein each integral part is inputted to the lookup table 63, which obtains the sum of exponential terms of base-2 function in each decimal part.

On the one side, each integral part split by the split 61 is inputted to the comparator 62, which obtains the maximum or minimum integer value to output the same to the subtractor 64. At the subtractor 64, a difference between the original integral part and the maximum or minimum integer value is calculated. The difference is forwarded to the shifter 65, which shifts the decimal part fed thereto from the lookup table 63 by the difference.

Thereafter, the adder 66 performs an addition operation on the values of the shifted decimal parts and sends the same to the log pre-processing block 67 and the log 2 lookup table 68. Next, at the adder 69 the integral part from the comparator 62 and the decimal part from the log pre-processing block 67 and the log 2 lookup table 68 are added to obtain the final value of the base-2 function. Thereafter, the final value is forwarded to the subtractor 80, which calculates the final LLR.

Finally, the subtractor 80 subtracts zero-likelihood value calculated at the likelihood-2 calculator 70 from the one-likelihood value calculated at the likelihood-1 calculator 60 to obtain LLR.

As mentioned above, in the case that LLR value is calculated using a base-e function, the size of hardware is proportional to the number of the base-e function calculators. But, in the structure proposed by the present invention, although the number of the comparator, the $2^{Af}$ lookup table, the shifter and the subtractor is proportional to that of necessary base-2 functions, the number of the log pre-processing block and the log 2 lookup table is fixed, to thereby making it possible to reduce the hardware requirement. Further, the use of the base-2 function makes it easier to implement the hardware and possible to obtain the greatest possible precision within the limit provided by a fixed decimal point.

In implementing the turbo decoder based on MAP scheme, the base-e function is a critical element that it has an effect on the size of the hardware as well as the performance of the turbo decoder according to a calculation precision.

In accordance with the present invention, the base-2 binary LogMAP algorithm instead of with the MAP algorithm based on the natural logarithm is utilized to implement a simple and precise calculation during the process of the base-e function. Thus, the present invention allows the base-e function to be changed to the base-2 function and uses an Approximated Binary Exponential and Logarithmic Algorithm (ABELA), resulting in a small-sized hardware and an improved precision of calculation.

In implementing a turbo code used as an error correction code in the next generation mobile communication technology such as IMT-2000, implementing ASIC using the structure of the present invention results in a reduced area and improved performance of ASIC, which in turn, strengthen competition in the communication technologies.

The method previously described may be implemented with a program and stored in a computer-readable medium including a random access memory (RAM), read only memory (ROM), compact disk ROM, fixed or flexible disk media, PC Card flash disk memory, tape, optical magnetic disk, or any other storage retrieval means, or any combination of these storage retrieval means.

As mentioned above, in implementing a turbo decoder using a binary LogMAP algorithm, the present invention utilizes a base-2 function easy to implement hardware instead of with a complex base-e function used in a conventional LogMAP algorithm, and applies an Approximated Binary Exponential and Logarithmic Algorithm (ABELA) during calculation, to thereby result in a small-sized hardware and a high-precision decoder. Furthermore, the present invention decreases the computational burden needed to calculate the value of forward and backward state metrics and allows the calculation of LLR to be performed at a high-speed, to thereby reduce the hardware requirement as against the conventional turbo decoder based on LogMAP algorithm and implement a high-speed turbo decoder.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A turbo decoder for decoding codes used as an error correction code in wireless communication systems, wherein a binary LogMAP algorithm is used, comprising:

means for splitting the sum of two input state metrics into an integral and a decimal part;

means for comparing the integral parts of the two state metrics with one another to extract a maximum and a minimum integer value therefrom;

means for obtaining a difference between the original integral part and the maximum or minimum integer value;

means for calculating the sum of exponential terms of base-2 function in the decimal parts of the two input state metrics split by the splitting means;

means for shifting only a decimal part with a smaller integral part among the exponential sums by the difference;

a first addition means for adding the decimal part shift by the shifting means and a decimal part with a larger integral part among the exponential sums;

means for applying a base-2 logarithm on the decimal part added by the adding means to thereby obtain a final value for the decimal part; and a second addition means for adding the maximum integral value from the comparing means and the final value for the decimal part from the applying means to thereby obtain a final value of the base-2 function.

2. The turbo decoder as recited in claim 1, wherein the binary LogMAP algorithm uses the base-2 function instead of with base-e function to implement the LLR with a small-sized lookup table and logic circuit, and offers the greatest possible precision by a fixed decimal point.

3. A turbo decoder for decoding codes used as an error correction code in wireless communication systems, wherein a binary LogMAP algorithm is used, comprising:

means for splitting the sum of each input state metrics into an integral and a decimal part;

means for comparing the integral parts of said each state metrics with one another to extract a maximum and a minimum integer value therefrom;

a first subtraction means for calculating a difference between the original integral part and the maximum or minimum integer value;

means for calculating the sum of exponential terms of base-2 function in the decimal parts of said each input state metrics split by the splitting means;

means for shifting the sum of exponential terms of the decimal parts by the difference;

a first addition means for adding the sums of exponential terms of the decimal parts shift by the shifting means;

means for applying a base-2 logarithm on the decimal parts added by the first addition means to thereby obtain a final value for the decimal part;

a second addition means for adding the maximum integral value from the comparing means and the final value for the decimal part from the applying means to thereby obtain a final value of the base-2 function; and a second subtraction means for subtracting likelihood values according to the final value of base-2 function to thereby obtain a log-likelihood ratio (LLR).

4. The turbo decoder as recited in claim 3, wherein the binary LogMAP algorithm uses the base-2 function instead of with base-e function to implement the LLR with a small-sized lookup table and logic circuit, and offers the greatest possible precision by a fixed decimal point.

5. A method of implementing a turbo decoder decoding codes used as an error correction code in wireless communication systems, wherein a binary LogMAP algorithm is used, the method comprising the steps of:

(a) splitting the sum of two input state metrics into an integral and a decimal part;

(b) comparing the integral parts of the two state metrics with one another to extract a maximum and a minimum integer value therefrom;

(c) obtaining a difference between the original integral part and the maximum or minimum integer value;

(d) retrieving the sum of exponential terms of base-2 function in the decimal parts of the two input state metrics, and shifting only a decimal part with a smaller integral part among the exponential sums by the difference;

(e) adding the shifted decimal part and a decimal part with a larger integral part among the exponential sums, and applying a base-2 logarithm on the added decimal part to thereby obtain a final value for the decimal part; and (f) adding the maximum integral value and the final value for the decimal part to thereby obtain a final value of the base-2 function.

6. The method as recited in claim 5, wherein the binary LogMAP algorithm uses the base-2 function instead of with base-e function to implement the LLR with a small-sized lookup table and logic circuit, and offers the greatest possible precision by a fixed decimal point.

7. A method of implementing a turbo decoder decoding used as an error correction code in wireless communication systems, wherein a binary LogMAP algorithm is used, the method comprising the steps of:

(a) splitting the sum of each input state metrics into an integral and a decimal part;

(b) comparing the integral parts of said each state metrics with one another to extract a maximum and a minimum integer value therefrom;

(c) calculating a difference between the original integral part and the maximum or minimum integer value;

(d) calculating the sum of exponential terms of base-2 function in the decimal parts of said each input state metrics, and shifting the sum of exponential terms of the decimal parts by the difference;

(e) adding the sums of exponential terms of the shifted decimal parts, and applying a base-2 logarithm on the added decimal parts to thereby obtain a final value for the decimal part;

(f) adding the maximum integral value and the final value for the decimal part to thereby obtain a final value of the base-2 function; and (g) subtracting likelihood values according to the final value of base-2 function to thereby obtain a log-likelihood ratio (LLR).

8. The method as recited in claim 7, wherein the binary LogMAP algorithm uses the base-2 function instead of with base-e function to implement the LLR with a small-sized lookup table and logic circuit, and offers the greatest possible precision by a fixed decimal point.

9. A computer-readable medium, in a turbo decoder incorporating a processor therein, storing a program for implementing the following functions of:

wherein a binary LogMAP algorithm is used, splitting the sum of two input state metrics into an integral and a decimal part;

comparing the integral parts of the two state metrics with one another to extract a maximum and a minimum integer value therefrom;

obtaining a difference between the original integral part and the maximum or minimum integer value;

calculating the sum of exponential terms of base-2 function in the decimal parts of the two input state metrics, and shifting only a decimal part with a smaller integral part among the exponential sums by the difference;

adding the shifted decimal part and a decimal part with a larger integral part among the exponential sums, and applying a base-2 logarithm on the added decimal part to thereby obtain a final value for the decimal part; and adding the maximum integral value and the final value for the decimal part to thereby obtain a final value of the base-2 function.

10. A computer-readable medium, in a turbo decoder incorporating a processor therein, storing a program for implementing the following functions of:

wherein a binary LogMAP algorithm is used, splitting the sum of each input state metrics into an integral and a decimal part;

comparing the integral parts of said each state metrics with one another to extract a maximum and a minimum integer value therefrom;

calculating a difference between the original integral part and the maximum or minimum integer value;

retrieving the sum of exponential terms of base-2 function in the decimal parts of said each input state metrics, and shifting the sum of exponential terms of the decimal parts by the difference;

adding the sums of exponential terms of the shifted decimal parts, and applying a base-2 logarithm on the added decimal parts to thereby obtain a final value for the decimal part;

adding the maximum integral value and the final value for the decimal part to thereby obtain a final value of the base-2 function; and subtracting likelihood values according to the final value of base-2 function to thereby obtain a log-likelihood ratio (LLR).

* * * * *